United States Patent
Forstner

(10) Patent No.: US 9,720,016 B2
(45) Date of Patent: Aug. 1, 2017

(54) MEASURING ARRANGEMENT FOR MEASURING AN EFFECTIVE VALUE OF AN AC VOLTAGE IN A HANDHELD POWER TOOL

(71) Applicant: Hilti Aktiengesellschaft, Schaan (LI)

(72) Inventor: Markus Forstner, Landsberg (DE)

(73) Assignee: Hilti Aktiengesellschaft, Schaan (LI)

( * ) Notice: Subject to any disclaimer, the term of this patent is extended or adjusted under 35 U.S.C. 154(b) by 63 days.

(21) Appl. No.: 14/649,116

(22) PCT Filed: Nov. 26, 2013

(86) PCT No.: PCT/EP2013/074721
§ 371 (c)(1),
(2) Date: Jun. 2, 2015

(87) PCT Pub. No.: WO2014/086617
PCT Pub. Date: Jun. 12, 2014

(65) Prior Publication Data
US 2015/0316585 A1 Nov. 5, 2015

(30) Foreign Application Priority Data
Dec. 3, 2012 (DE) .................. 10 2012 222 055

(51) Int. Cl.
*G01R 15/04* (2006.01)
*G01R 19/00* (2006.01)
(Continued)

(52) U.S. Cl.
CPC ............ *G01R 15/04* (2013.01); *B25D 17/00* (2013.01); *B25F 5/00* (2013.01); *G01R 19/0084* (2013.01); *B25D 2250/221* (2013.01)

(58) Field of Classification Search
None
See application file for complete search history.

(56) References Cited

U.S. PATENT DOCUMENTS

| 4,757,242 A | 7/1988 | Prather |
| 5,499,155 A | 3/1996 | Gershen et al. |

(Continued)

FOREIGN PATENT DOCUMENTS

| DE | 10 2010 030 098 A1 | 12/2011 |
| EP | 0 874 436 A2 | 10/1998 |

(Continued)

OTHER PUBLICATIONS

PCT/EP2013/074721, International Search Report dated Feb. 21, 2014 (Two (2) pages).

(Continued)

*Primary Examiner* — Paresh Patel
(74) *Attorney, Agent, or Firm* — Crowell & Moring LLP

(57) ABSTRACT

A hand-held power tool is disclosed with a measuring system for determining an effective value of an alternating voltage which is fed via an external conductor with respect to a neutral conductor. A regulated direct voltage source has a power supply potential which is referenced to the neutral conductor. There is a first resistance value from the power supply potential to a tap and a second resistance value from the tap to a ground. A voltmeter has a measurement range and its measurement input is connected to the tap. A measurement line connects the tap to the external conductor. The first resistance value is lower than the second resistance value such that the mean voltage value on the tap is equal to the mean of the measurement range for one period of the alternating voltage.

4 Claims, 4 Drawing Sheets

(51) Int. Cl.
*B25F 5/00* (2006.01)
*B25D 17/00* (2006.01)

(56) References Cited

U.S. PATENT DOCUMENTS

| | | | |
|---|---|---|---|
| 9,498,872 B2 | 11/2016 | Fielitz et al. | |
| 2010/0127691 A1 | 5/2010 | Gass et al. | |
| 2011/0301861 A1* | 12/2011 | Elder | G01N 27/3274 |
| | | | 702/19 |

FOREIGN PATENT DOCUMENTS

| | | | | | |
|---|---|---|---|---|---|
| GB | | 2480010 A | 11/2011 | | |
| LI | DE | 102012222055 A1 * | 6/2014 | | B25D 17/00 |

OTHER PUBLICATIONS

European Office Action issued in European counterpart application No. 13 795 761.9-1568 dated Oct. 6, 2016 (Seven (7) pages).
Pete Wilson: "Application Report High-Voltage Signal Conditioning for Low-Voltage ADCs", Jun. 1, 2004, XP055306341, URL:http://www.ti.com/lit/an/sboa097/sboa097.pdf, 11 total pages.

* cited by examiner

MEASURING ARRANGEMENT FOR MEASURING AN EFFECTIVE VALUE OF AN AC VOLTAGE IN A HANDHELD POWER TOOL

This application claims the priority of International Application No. PCT/EP2013/074721, filed Nov. 26, 2013, and German Patent Document No. 10 2012 222 055.0, filed Dec. 3, 2012, the disclosures of which are expressly incorporated by reference herein.

BACKGROUND AND SUMMARY OF THE INVENTION

The present invention relates to a measuring system for measuring an effective value of an AC voltage of a three-phase or multi-phase, rotary-phase AC voltage, in particular in a hand-held power tool, and to a corresponding hand-held power tool. The power supply to the hand-held power tool is provided through an AC voltage, which may be subject to great fluctuations, depending on the standards and local loads on the system. Safety equipment, in particular overload cutoffs, may depend on the prevailing AC voltage. The corresponding measured values are supplied by the measuring system according to the invention.

A feeder line for a three-phase rotary phase AC current includes three external conductors and often one neutral conductor. The voltages, typically sinusoidal, on the external conductors, are each in a different phase with respect to the neutral conductor in order to supply electric power to the hand-held power tool. The reference potential of the neutral conductor can also be generated by a star connection of the external conductors within the hand-held power tool in a known way. The effective value of the sinusoidal AC voltage U is determined by a voltmeter, which records and squares the AC voltage on an external conductor with respect to the neutral conductor.

For integration into the additional circuits of the hand-held power tool, the voltmeter would expediently be designed as an electric component operated by direct voltage. However, the reference potentials, i.e., the power supply voltage and ground, would be decoupled from the AC voltage potentials, and any resulting offsets would influence the measurement of the effective value.

The hand-held power tool according to the invention has a measuring system for determining an effective value of an AC voltage supplied over an external conductor with respect to a neutral conductor. A regulated DC voltage source has a power supply potential, which is referenced to the neutral conductor. The DC voltage source adjusts the potential of a ground with respect to the power supply potential. A voltage divider is suspended between the power supply voltage and the ground. There is a first resistance value from the power supply potential to a tap, and there is a second resistance value from the tap to ground. A voltmeter has a measurement range, and its measurement input is connected to the tap. The voltmeter measures the voltage at the tap and determines the effective voltage from that. A measurement line connects the tap to the external conductor. The first resistance value is selected to be lower than the second resistance value, such that the average voltage value at the tap is equal to the middle of the measurement range for one period of the AC voltage.

The measuring system, in particular the voltage divider, can be designed and operated independently of the AC voltage fed into it. This is of interest in particular with regard to different national electric power supplies. The measurement range of the voltmeter is then utilized optimally. A possible offset based on the decoupled potentials of ground from the neutral conductor is compensated easily but nevertheless skillfully.

A voltage divider determines the effective voltage from individual measurements of the voltage at the tap. This may take place in a known manner by integration, by an analog or numerical method or by determining the maximum value of the preferably sinusoidal AC voltage and calculating the effective value based on the maximum value.

One embodiment provides that the following equation holds: R1/R2=(1−Vcc/Max), where R1 is the first resistance value (R1), R2 is the second resistance value, Vcc is the power supply voltage potential and Max is the upper limit voltage of the measurement range (Mb).

The hand-held power tool is in particular a hand-held power tool, such as an electric screwdriver, a hand-held drill, a chisel hammer, a combination hammer, a battery-operated screwdriver, a circular saw or a reciprocating saw.

The following description explains the invention on the basis of exemplary embodiments and figures.

DETAILED DESCRIPTION OF THE DRAWINGS

Figure 1:
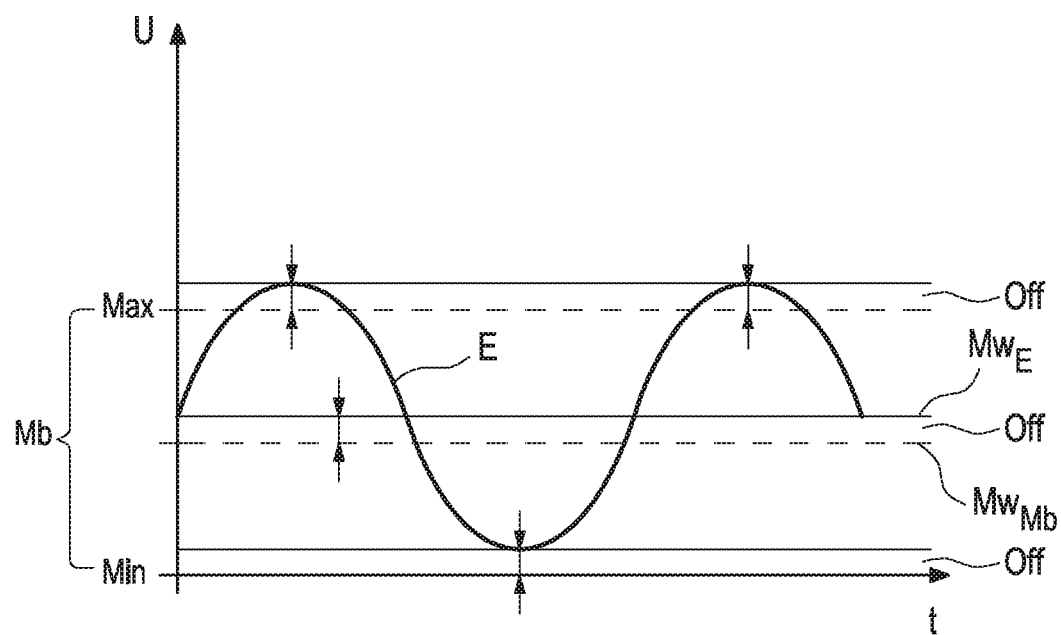
FIG. 1: an illustration of a measurement of the voltmeter.

The same elements or those having the same function are indicated by use of the same reference numerals in the figures, unless otherwise indicated.

Figure 2:
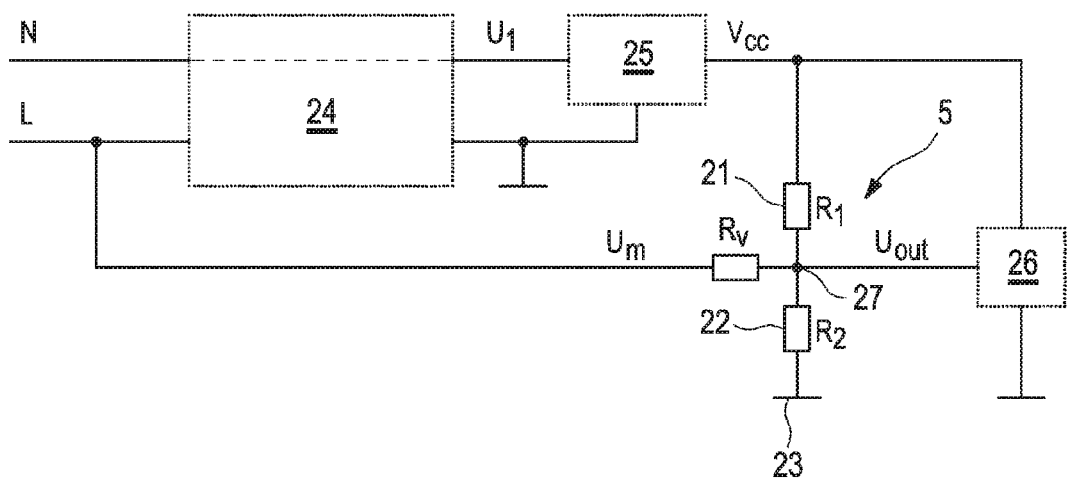
FIG. 2: a schematic block diagram of one embodiment of a measuring system for measuring an effective value of an AC voltage in a hand-held power tool.

FIG. 2 shows a schematic block diagram of one embodiment of a measuring system 5 for measuring the effective value E of the alternating voltage U in a hand-held power tool.

This shows the neutral conductor N and an exterior conductor L of a three-phase current feed. A power supply 24 carries the current to the internal consumer of the hand-held power tool, for example a motor. A DC voltage regulator 25 supplies a direct voltage range. The direct voltage regulator 25 taps the alternating voltage and converts the alternating voltage U1 into a fixed regulated direct voltage Vcc. The direct voltage regulator 25 references its potential to the voltage U1 of the neutral conductor L. The direct voltage regulator 25 pulls a ground 23 to a corresponding potential. The ground 23 is decoupled with respect to the potential Um of the external conductor L.

A voltmeter 26 is supplied with power by the direct voltage Vcc of the direct voltage regulator 25. The voltmeter 26 utilizes the ground 23 as reference potential. The voltmeter 26 has a predefined measurement range, which is between ground 23 and the power supply voltage Vcc due to the power supply. The design of the voltmeter 26 can further restrict the measurement range and its resolution. As shown in FIG. 1, the measurement range Mb is limited at the top by the voltage max and at the bottom by the voltage min. The mean value MwMb of the measurement range Mb is the arithmetic mean of min and max. The measurement input of the voltmeter 26 is indirectly connected to the external conductor L. A measuring system 5 between the external conductor L and the A/D converter ensures an adaptation of the voltage level to maximally utilize the measurement range of the A/D converter 26.

Measuring system 5 also comprises a series resistor $R_v$ and a voltage divider comprised of a first ohmic resistor 21 and a second ohmic resistor 22 with unequal resistance values $R_1$, $R_2$. The voltage divider 21, 22 is of dimensions such that the mean value $Mw_E$ of the alternating voltage U to be measured corresponds to the mean value $Mw_{Mb}$ of the measurement range Mb.

The voltmeter 26 records the voltage Uout at the tap 27 for at least one period of the alternating voltage. The effective voltage can be calculated by integration (quadrature) of the recorded voltage Uout or with the assumed sinusoidal voltage calculated from the peak value of the voltage Uout. The voltmeter 26 may contain an A/D converter and optionally an integrator.

Figure 3:
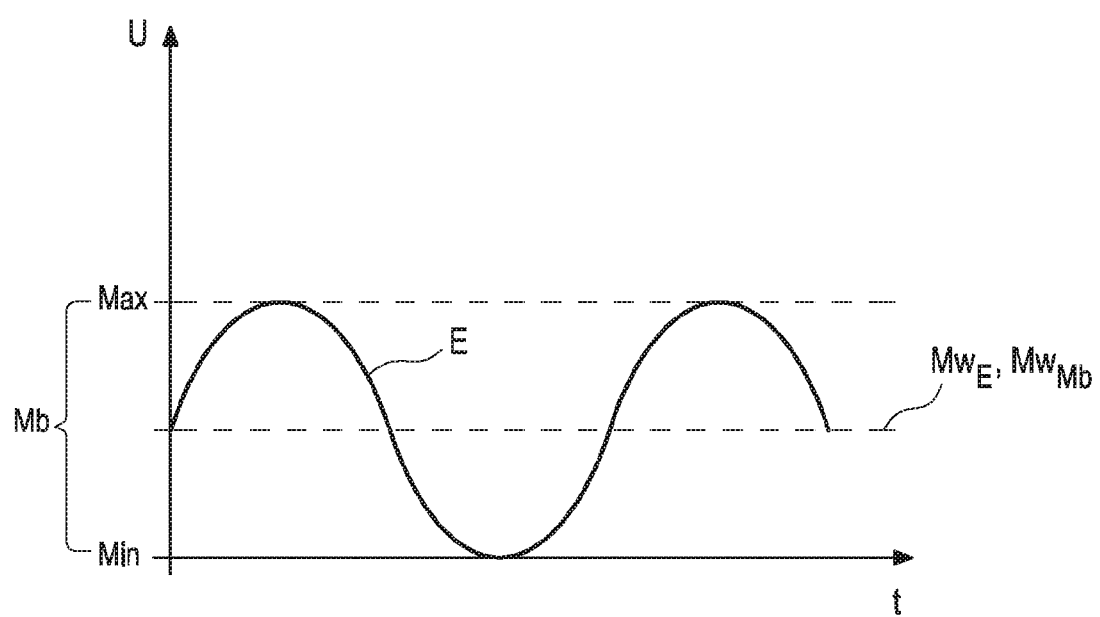
FIG. 3: a measurement result of one embodiment of measuring an effective value of an AC voltage in a hand-held power tool.

FIG. 3 shows a measurement result of measurement of the effective value E of the alternating voltage U in a hand-held power tool according to the embodiment shown in FIG. 2. Due to the dimensioning of the voltage divider 21, 22 shown above, the mean value $Mw_E$ of the effective value E of the alternating voltage U to be measured corresponds to the mean value $Mw_{Mb}$ of the measurement range Mb, which thus prevents an offset between the mean value $Mw_E$ of the effective value E of the alternating voltage U to be measured and the mean value $Mw_{Mb}$ of the measurement range Mb, as shown in FIG. 1. The measurement range Mb is utilized optimally in this way.

The calculation of the dimensioning of the voltage divider 21, 22 is shown below. Um is the alternating voltage potential on the external conductor L, Rv is the resistance value of the series resistor Rv, Uout is the potential at the measurement tap 27 of the voltage divider 21, 22.

The following expression can be derived from Kirchoffs first law:

$$\frac{U_m - U_{out}}{R_V} + \frac{V_{CC} - U_{out}}{R_1} = \frac{U_{out}}{R_2} \quad (1)$$

The measuring system is designed for a maximum peak voltage $\hat{U}$, which is represented as the Max of the measurement range Mb:

$$U_{out} = V_{CC}; U_m = U_1 + \hat{U}$$

When inserted into equation (1), this yields $$R_2 = \frac{V_{CC}}{\hat{U} + U_1 - V_{CC}} \cdot R_V \quad (2)$$

At the maximum measurable negative peak voltage $\hat{U}$, which represents the least of the value Min that can be displayed by the voltmeter, it holds that:

$$U_{out} = 0V; U_m = U_1 - \hat{U}$$

Again, when inserted into equation (1), it then follows that:

$$R_1 = \frac{V_{CC}}{\hat{U} - U_1} \cdot R_V \quad (3)$$

At the zero crossing, it holds that $U_m = U_1$ and it should hold that $U_{out} = \frac{1}{2} \cdot Vcc$.

Two variants 1 and 2 of the method described above are shown below as examples.

Variant 1:
Desired measurement range $\pm 288 V_{eff}$; $\hat{U} = \pm 407 V_{peak}$
Output voltage OF power supply: $U_1 = 7.3V$
Power supply A/D converter: Vcc=5.0V
Series resistor Rv=204 kΩ
  $R_1 = 2.55$ kΩ
  R2=2.49 kΩ
Variant 2:
In this simplified variant, the power supply directly supplies the power supply voltage of the A/D converter, which means that $U_1 = Vcc$.
Thus the two equations (2) and (3) are simplified to:

$$R_2 = \frac{V_{CC}}{\hat{U}} \cdot R_V \quad (2')$$

$$R_1 = \frac{V_{CC}}{\hat{U} - V_{CC}} \cdot R_V \quad (3')$$

Desired measurement range: $\pm 264 V_{eff} = 380 V_{peak}$
Output voltage power supply: $U_1 = 5.0V$
Power supply A/D converter: Vcc=5.0V
Series resistor Rv=204 kΩ
  $R_1 = 2.72$ kΩ
  R2=2.68 kΩ

Figure 4:
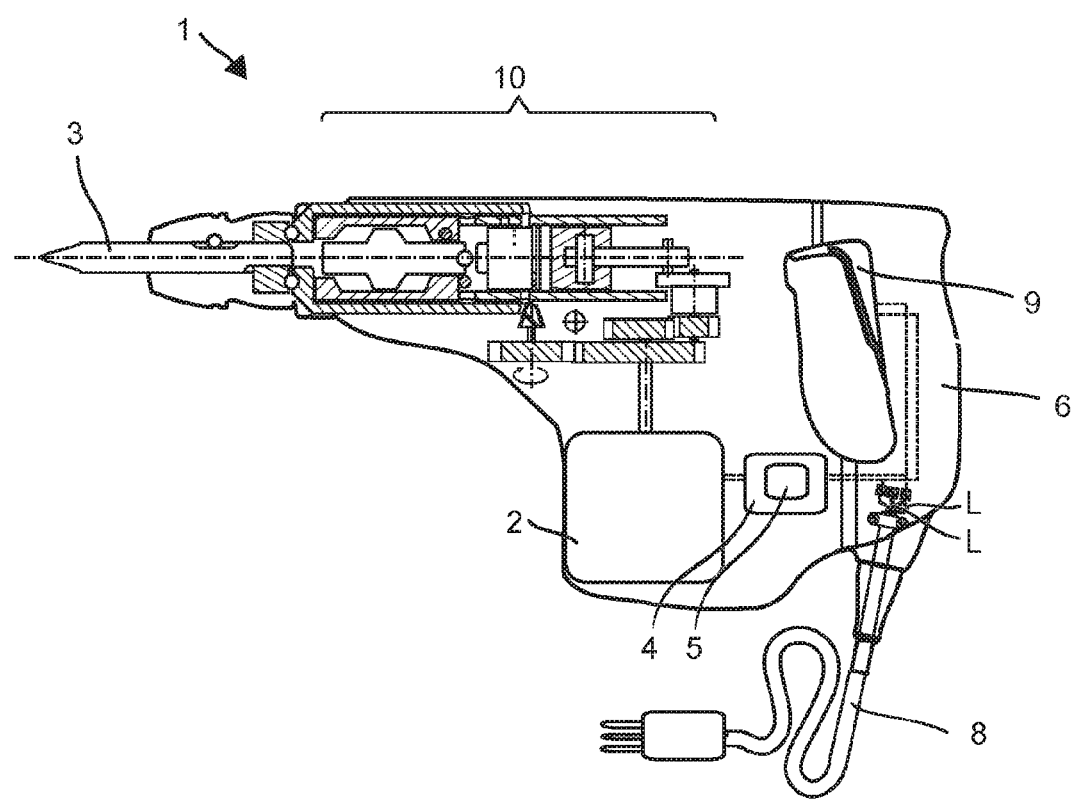
FIG. 4: a schematic block diagram of one embodiment of a hand-held power tool.

FIG. 4 shows a schematic block diagram of a first exemplary embodiment of a hand-held power tool 1, for example a jackhammer.

The hand-held power tool 1 comprises an electric motor 2 which drives a tool 3, for example by means of a gear, a striker mechanism 10, etc. In addition, the hand-held power tool 1 has a control unit 4 for controlling the electric motor 2. The control unit 4 controls for example a power supply of the electric motor 2 and thereby controls a torque and/or a rotational speed of the electric motor 2.

A user starts operation of the hand-held power tool 1 by operating a button 9. The button 9 is preferably arranged on a handle 6 with which the user can hold and guide the hand-held power tool 1.

A power cord 8 on the hand-held power tool 1 supplies power as an electric voltage to the control unit 4 and the electric motor 2 as a function of the operation of the button 9. The power cord 8 preferably has three potential carrying lines (external conductors L). The power cord 8 may contain a neutral conductor N or the neutral conductor N may be guided by a star connection within the hand-held power tool 1 to the control unit 4 and the measuring system 5.

A measuring system 5 serves to measure an effective value of an alternating voltage in the hand-held power tool 1. In the exemplary embodiment of the hand-held power tool 1 shown in FIG. 4, the measuring system 5 is part of the control unit 4. However, the measuring system 5 may also be arranged differently in the hand-held power tool 1, for example, as a separate component outside of the control unit 4.

The invention claimed is:
1. A hand-held power tool having a measuring system for determining an effective value of an alternating voltage supplied via an external conductor with respect to a neutral conductor, comprising:
  a regulated direct voltage source;

a voltmeter which is supplied with power by the direct voltage source;

a voltage divider disposed between a power supply potential and a ground and which has a first resistor between the power supply potential and a tap and a second resistor between the tap and the ground;

wherein the voltmeter has a measurement range whose measurement input is connected to the tap and determines an effective voltage from a voltage on the tap; and a measurement line which connects the tap to the external conductor;

wherein a first resistance value of the first resistor is lower than a second resistance value of the second resistor such that an average voltage value at the tap is equal to a mean of the measurement range for a period of the alternating voltage.

2. The hand-held power tool according to claim 1, wherein the following equation holds: $R1/R2=(1-Vcc/Max)$, where R1 is the first resistance value, R2 is the second resistance value, Vcc is the power supply potential and Max is an upper limit voltage of the measurement range.

3. The hand-held power tool according to claim 1, wherein the measurement line includes a series resistor.

4. The hand-held power tool according to claim 1, further comprising an electric motor supplied with the alternating voltage.

* * * * *